United States Patent [19]
Fletcher et al.

[11] Patent Number: 4,849,903
[45] Date of Patent: Jul. 18, 1989

[54] DIGITALLY CONTROLLED SYSTEM FOR EFFECTING AND PRESENTING A SELECTED ELECTRICAL RESISTANCE

[75] Inventors: James C. Fletcher, Washington, D.C.; Walter L. Ross, Simi Valley, Calif.

[73] Assignee: The United States of America as represented by the Administrator of the National Aeronautics and Space Administration, Washington, D.C.

[21] Appl. No.: 73,541

[22] Filed: Jul. 15, 1987

[51] Int. Cl.$^4$ .................. G01N 27/04; G05B 24/02
[52] U.S. Cl. .................. 364/482; 364/481; 324/62; 323/354
[58] Field of Search .................. 364/482, 481; 324/62, 324/63; 323/353, 354

[56] References Cited

U.S. PATENT DOCUMENTS

| | | | |
|---|---|---|---|
| 3,947,701 | 3/1976 | Russell, Jr. | 324/63 |
| 4,261,038 | 4/1981 | Johns et al. | 364/482 |
| 4,575,714 | 3/1986 | Rummel | 364/482 |
| 4,713,602 | 12/1987 | Ueda | 323/354 |
| 4,728,881 | 3/1988 | Evans et al. | 324/62 |

OTHER PUBLICATIONS

"Binary Programmed Power Supply", by B. E. Bachman, IBM Tech. Discl. Bulletin, vol. 9, No. 10, Mar. 1967, p. 1330.

*Primary Examiner*—Parshotam S. Lall
*Assistant Examiner*—V. N. Trans
*Attorney, Agent, or Firm*—William J. Sheehan; John Manning; Charles E. B. Glenn

[57] ABSTRACT

A digitally controlled resistance generator (10) in which resistors (16-38) having values selected according to an expression $2^{N-1}(R)$, where N is equal to the number of terms in the expression, and R is equal to the lowest value of resistance, are electrically inserted into a resistive circuit in accordance with a parallel binary signal provided by an analog-to-digital converter (46) or a programmable computer (75). This binary signal is coupled via optical isolators (50-72) which, when activated by a logical "1," provides a negative potential to some or all of the gate inputs (96) of the normally "on" field effect transistors (98-120) which, when "on," shorts out the associated resistor. This applied negative potential turns the field effect transistors "off" and electrically inserts the resistor coupled between the source terminal (124) and the drain terminal (122) of that field effect transistor into the resistive circuit between the terminals (12, 14).

8 Claims, 2 Drawing Sheets

DIGITALLY CONTROLLED SYSTEM FOR EFFECTING AND PRESENTING A SELECTED ELECTRICAL RESISTANCE

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

TECHNICAL FIELD

This invention relates generally to circuits which produce resistance and more particularly to a digitally controlled system for effecting and presenting a selected resistance wherein serially connected resistors are shorted or included in a resistive circuit by switching devices which are operated by a plurality of digital signals.

BACKGROUND OF THE INVENTION

In the field of electronics, it is occasionally necessary to utilize a device which selectively generates an electrical resistance which is used to load a circuit. As an example, during the testing and troubleshooting of power supplies, a decade box may be connected across the power terminals and, in conjunction with a volt meter and an ammeter, one may ascertain whether or not the power supply is performing at its rated capability. This is achieved by changing the resistance of the decade box, and thus the load on the power supply, while observing current and voltage measurements taken by the ammeter and volt meter. While a decade box can be used to generate a variable resistance, it is a cumbersome device which requires the user to incrementally operate several rotary switches to obtain the desired resistance. Further, a smoothly rising or falling resistance would be almost impossible to duplicate with a decade box because of the necessity to operate several of these rotary switches simultaneously.

Another device for generating a variable resistance is a potentiometer. While this device can be used to generate a variable resistance, it is a mechanical device and is subject to wear and mechanical failure. Further, potentiometers are limited to a single range of resistance, requiring a potentiometer for each desired range of resistance.

Other devices which may be used to generate a variable resistance include digitally controlled audio attenuators, two types of which are manufactured by National Semiconductor and DBX of New York. The National device can be incremented in 3 db steps, which attenuates voltage or current by a factor 0.5, while the DBX device is capable of attenuating in 1 db steps. Problems with these attenuators, however, are that even the smallest db steps do not provide the resolution necessary to mimic a smoothly rising or falling resistance. Further, they cannot duplicate a linear resistive output because of logarithmic characteristics associated with attenuators. Still further, these attenuators exhibit distortions which may be tolerable at audio frequencies but which make them unsuitable to duplicate precise resistances, particularly below 100 ohms.

Yet another device that can generally provide a variable resistive output is an optical light emitting coupler manufactured by Clairex Company. It consists of a cadmium sulfide photocell and a light source mounted in close proximity to each other within a tubular housing. In operation, the photocell changes its resistance responsive to the degree of illumination provided by the light source. The major problem with this device is that the resistive output is not linear with respect to a variable voltage applied to the light source.

It is therefore an object of this invention to provide a digitally controlled variable resistance generator which has no mechanical parts and which is further capable of providing a multitude of linear ranges of resistance.

SUMMARY OF THE INVENTION

In accordance with this invention, a resistance producing circuit is constructed wherein a digital data source provides digitally encoded binary bits. Each discrete bit is applied to a control input of one of a plurality of switching devices, each device having a pair of terminals which are switched responsive to the discrete bit. These switching devices are serially coupled by their pairs of terminals, and each switching device further has a resistor coupled between these switched terminals. These resistors are selectively electrically removed or included in a summing circuit responsive to the discrete bits to generate a resistive output which is linear with respect to the sequence of digitally encoded bits.

DETAILED DESCRIPTION OF THE DRAWINGS

Figure 1:
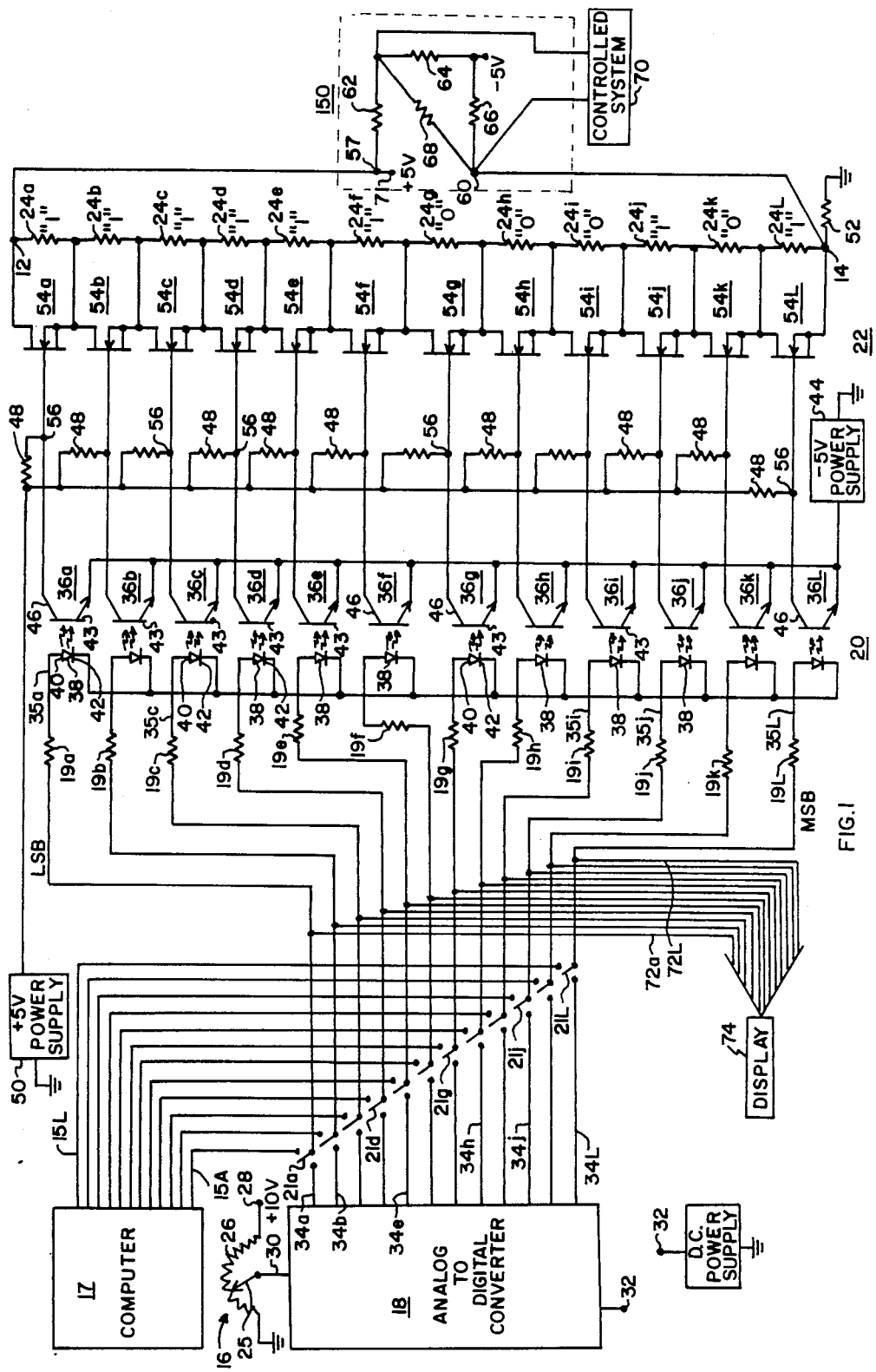
FIG. 1 is a partial schematic and partial block diagram of a resistance producing circuit.

Referring to FIG. 1, there is shown a system wherein a selected resistance may be provided between terminals 12 and 14. This system includes, in operational sequence, a variable voltage unit 16 (or digital computer) 17, a 12 bit A-D converter 18, a bank 20 of optoisolators which provide an isolated output signal responsive to each bit of the A-D converter, and a bank 22 of FETs (field effect transistors), each of which is operated "off" when a bit output of the A-D converter goes high. Finally, selected values of resistors 24a–24L, in accordance with binary related voltages, are connected across the source-drain terminals of the FETs and in series with one another. By then turning off discrete FETs in terms of selected voltage values producing selected encoded outputs of A-D converter 18, selected values of total resistance may be caused to appear at resistance output terminals 12 and 14.

Variable volage unit 16 employs a potentiometer 26 connected between +10-volt terminal 28 and ground of a source of D.C. (not shown). The wiper arm 25 of potentiometer 26 is connected to input 30 of 12-bit analog-to-digital converter 18. Converter 18, which is powered by D.C. applied to its plus terminal 32 and its ground terminal, conventionally divides the input voltage into 4,095 output steps of 0.00244 volts/step. The 12 bits of the output of converter 18 appear on discrete bit leads 34a–34L, with lead 34a carrying the least significant bit (LSB) and lead 34L carrying the most significant bit (MSB). When a bit is representative of a logic "1," it provides an output voltage of +5 volts, and when a "0," it provides an output voltage of 0 volts. The following table illustrates the first and last 12-bit "words" of converter 18, their equivalent in the decimal system, and the voltages applied to input 30 which evokes these particular "words" from converter 18.

TABLE 1

| Binary | Decimal | Voltage on Input 30 |
|---|---|---|
| 000000000000 | 0 | 0 |
| 000000000001 | 1 | .00244 v. |
| 000000000010 | 2 | .00488 v. |
| 000000000011 | 3 | .00732 v. |
| 000000000100 | 4 | .00976 v. |
| 000000000101 | 5 | .01220 v. |
| ... | ... | ... |
| 111111111010 | 4090 | 9.9878 v. |
| 111111111011 | 4091 | 9.9900 v. |
| 111111111100 | 4092 | 9.9927 v. |
| 111111111101 | 4093 | 9.9951 v. |
| 111111111110 | 4094 | 9.9976 v. |
| 111111111111 | 4095 | 10.0000 v. |

A 0 and +5-volt output of A-D converter 18 appear on leads 34a–34L, this voltage being between one of these leads and ground.

Alternately, and typically, the generation of the voltages shown in Table 1 would be via a digital computer 17 which would provide these on 12-bit output leads 15a–15L. Computer 17 would, for example, provide the discrete voltages in a selected sequence and with a selected dwell for each voltage, these selections being insertable in the digital computer as a computer program.

Switches 21a–21L illustrate, for purposes of illustration, a selection of either voltage unit 16 or digital computer 17 as a voltage source. Depending upon the selected position of switches 21a–21L, the voltages on either leads 15a–15L or 34a–34L would be provided via current limiting resistors 19a–19L to control inputs 35a–35L of bank 20 of optoisolators 36a–36L.

Each of optoisolators 36a–36L includes an LED (light emitting diode) 38 having an anode 40 coupled to one of leads 35a–35L, with cathodes 42 of the LEDs being all connected to ground. Thus, when a +5-volt potential appears on a bit lead, an LED of a corresponding optoisolator is illuminated. Each optoisolator further includes an NPN phototransistor 43 positioned in close proximity to its LED. The emitter terminals of all of the phototransistors of the optoisolators are connected together and onto the negative terminal of −5 volts D.C. power source 44, the positive terminal of which is connected to ground. The collector terminals 46 of each phototransistor 43 are connected through a separate resistor 48 to the plus terminal of +5 volts power supply 50, the negative terminal of which is connected to ground.

The collector voltage levels of phototransistors 43, with respect to ground, appear as outputs of optoisolators 36a–36L with respect to terminal 14, which terminal is connected to ground through resistor 52. Output voltages from discrete ones of the optoisolators are applied to the gate inputs of like letter designated FETs 54a–54L. Such input voltage appears between the gate and source terminal of a FET, being provided through either the low "on" state resistances of other FETs or the parallel resistances of resistors 24a–24L, depending upon whether a given FET in series with the one in question is in the "on" or "off" state. In any event, the total series resistance to the source connection of each FET would be such that sufficient voltage would appear between the source and gate of each FET to turn it off whenever a related phototransistor is turned on, and vice versa. Clearly, in the example of resistance values cited below for the resistors 24a–24L, such would be the case. The FETs themselves have very low source to drain resistance, for example, 0.028 ohms, when turned on.

Resistors 24a–24L are arranged in letter corresponding order to the bit drive leads from A-D converter 18 and are selected to have resistive values in accordance with an expression $2^{N-1}(R)$, where R = a selected electrical resistance depending on the desired range of resistance, and N = the number of terms in the expression. For clarity, the following table illustrates the instance where R = 1 ohm and shows the values of resistors associated with each of the 12 bits represented as described on output lines 34a–34L.

TABLE 2

| 24a | $(2^0)$ (1) = | 1 ohm | 24g | $(2^6)$ (1) = | 64 ohms |
|---|---|---|---|---|---|
| 24b | $(2^1)$ (1) = | 2 ohms | 24h | $(2^7)$ (1) = | 128 ohms |
| 24c | $(2^2)$ (1) = | 4 ohms | 24i | $(2^8)$ (1) = | 256 ohms |
| 24d | $(2^3)$ (1) = | 8 ohms | 24j | $(2^9)$ (1) = | 512 ohms |
| 24e | $(2^4)$ (1) = | 16 ohms | 24k | $(2^{10})$ (1) = | 1024 ohms |
| 24f | $(2^5)$ (1) = | 32 ohms | 24L | $(2^{11})$ (1) = | 2048 ohms |

Accordingly, resistor 24a, having a least resistive value corresponding to R, or 1 ohm, is electrically inserted in circuit and electrically removed from a circuit with terminals 12 and 14 by FET 54a and optoisolator 36a responsive to the logic state of the least significant bit (LSB) applied to LSB line 35a. Conversely, resistor 24L, having a greatest resistive value corresponding to 2,048 ohms, is electrically inserted in circuit or electrically removed from circuit with terminals 12 and 14 by FET 54L and optoisolator 36L responsive to the logic state of the most significant bit (MSB) applied to MSB line 35L. Resistors 24b–24k, as shown by Table 1 and FIG. 1, are intermediate in resistive value between 1 and 2,048 ohms and are connected to their respective FETS to be inserted in circuit with terminals 12 and 14 responsive to logic states of discrete "bits" applied to intermediate lines 35b–35k.

It is to be noted that each of the sequential 4,095 "words" provided by A-D converter 18 is composed of 12 bits, meaning that each discrete "word" is representative of a discrete numerical value of resistance. In the case where R = 1 ohm, these resistances may be varied in increments as small as 1 ohm by incrementing the sequence of "words" applied to leads 35a–35L one "word" at a time.

The source-drain bias for FET's 54a–54L is provided through controlled system 70, which has a terminal voltage that should not exceed 10 volts for the embodiment shown. A polarity control circuit 150 insures correct polarity of the voltage seen by controlled system 70. While the polarity control circuit 150 may take any number of forms, a typical bridging network is disclosed. It should be recognized that other polarity control circuits could be used or, in fact, combined with controlled system 70. For the embodiment shown, +5 volts are applied to terminal 57, relative to ground, with a −5 volts being applied through resistor 66 to terminal 60. As shown, the "switched-in" resistors of resistors 24a–24L form one leg of bridge circuit 150. The other legs of the bridge are formed by resistors 62, 64, and 66, with resistor 68 connected across the output of the bridge. Controlled system 70 thus sees the combined output from "switched in" resistors with the correct polarity. Controlled system 70 may, for example, be an electronic or electromechanical system wherein the value of bridge elements supplied by resistors 24a–24L is adapted to provide a controlling effect.

In the event that it is desired to provide a readout of the digital number represented by the bit outputs of A-D converter 18 for a particular setting of potentiometer 26, leads 72a–72L may be connected to a digital display 74, which display would have an appropriate LED driver circuitry to effect the display.

Figure 2:
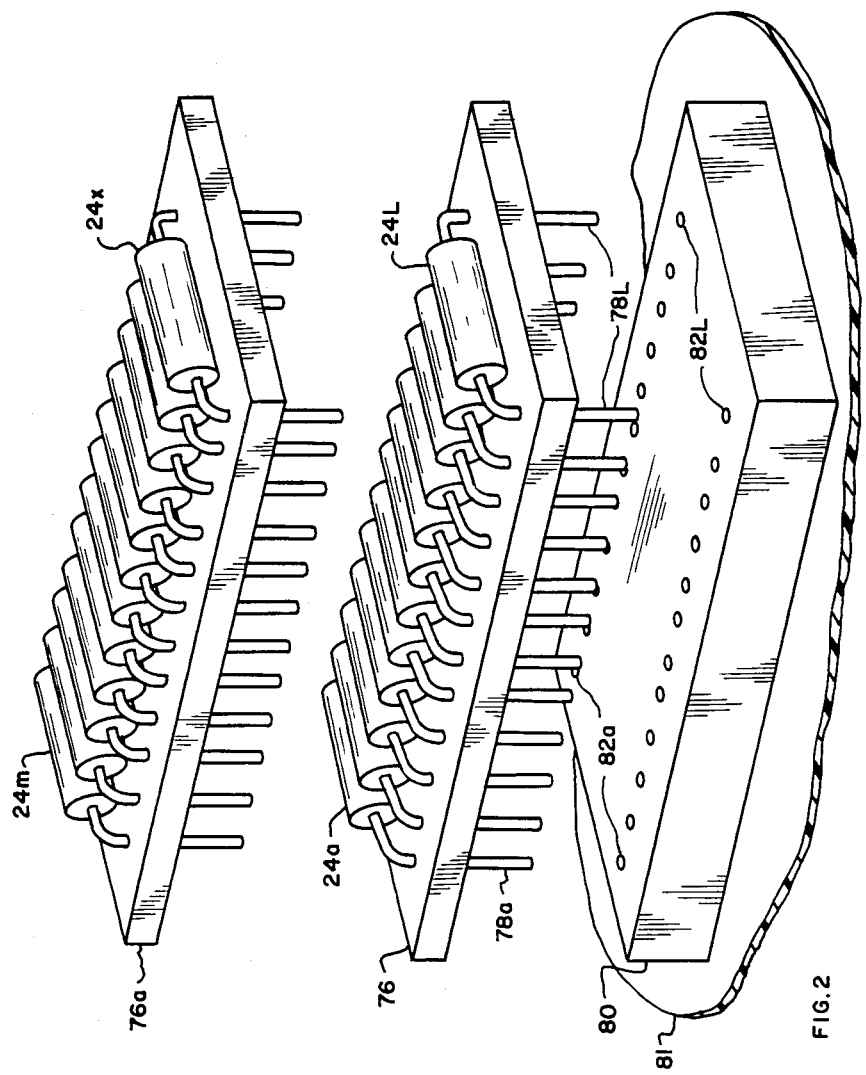
FIG. 2 is a partially cut-away view of a particular feature of the resistance producing circuit.

As a further feature of this invention, and as shown in FIG. 2, resistors 24a–24L are mounted on a removable carrier 76. Carrier 76 has pairs of electrical contact pins 78a–78L, with discrete ones of resistors 24a–24L being connected across discrete pairs of pins 78a–78L. Carrier 76 is plugged into a matching receptacle 80, which has matching pairs of electrical contact sockets 82a–82L. Receptacle 80 is mounted on circuit board 81 along with components (not shown) of the system shown in FIG. 1, with discrete pairs of contact sockets 82a–82L coupled across source-drain terminals of FETs 54a–54L. Thus, the range of resistors 54a–54L may be easily changed by simply substituting carrier 76 having resistors 24a–24L with another carrier 76a, with its resistors 24m–24x having a different range of values than resistors 24a–24L.

In operation, and in the absence of a binary "word" applied to leads 35a–35L, FETs 54a–54L are biased normally "on" as described by virtue of the +5-volt potential coupled via resistors 48 to the gate inputs of FETs 54a–54L. This effects a shorting of all of resistors 24a–24L by FETs 54a–54L, a condition which presents a low resistive value of 0.336 ohms between terminals 12 and 14. This resistive value is the combined internal resistance of FETs 24a–24L when they are switched "on" and is the lowest resistive value achievable by this circuit. If needed, the values of resistors connected across source and drain terminals of FETs 54a–54L may be selected to compensate for the internal resistance of FETs 54a–54L when switched "on."

In order to select a resistance, a voltage from 0 to 10 volts is selected by potentiometer 26 and applied to input 30 of analog-to-digital converter 18. For illustrative purposes, it is presumed that this voltage is selected to be 6.4 volts, meaning that 2,623 "words" out of 4,095 are used, which corresponds to an output logic state of 101000111111 binary. Alternately, computer 17 would be programmed to provide, as an output, the binary logic state of 101000111111. In either case, this binary state is applied to couplers 36a–36L as described and as shown in FIG. 1 and also to display 74. Display 74 and its circuitry decodes the above binary count and displays this count on display 74.

In the above examples, the binary logic state or count of 101000111111 on is shown in FIG. 1 as being applied via resistors 19a–19L to anodes 40 of LEDs 38. LEDs having a logical "1" on their anodes are illuminated, causing their proximate phototransistors 36a, 36b, 36c, 36d, 36e, 36f, 36j, and 36L to conduct. These conducting phototransistors apply a negative potential to gate inputs of FETs 54a, 54b, 54c, 54d, 54e, 54f, 54j, and 54L. These FETs are biased "off" by this negative potential and, due to the high internal resistance between the source and drain terminals of these FETs when "off," electrically inserts resistors 24a, 24b, 24c, 24d, 24e, 24f, 24j, and 24L in circuit with terminals 12 and 14. The resistors which are inserted in circuit with terminals 12 and 14 are illustrated in FIG. 1 as being labeled a logical "1," and resistors which are shorted are labeled with a logical "0." Thus, if R=1 ohm, and with the above binary count applied as described, it is seen that 2,623 ohms, or the sum of resistive values of resistors 24a, 24b, 24c, 24d, 24e, 24f, 24j, and 24L will be applied between terminals 12 and 14. Terminals 12 and 14 are coupled to terminals 71 and 60, respectively, of resistive bridge circuit 150, which produces a voltage differential across resistor 68 as an output. This voltage differential is varied responsive to the varied resistance between terminals 60 and 71, with the voltage differential being applied to system 70. System 70 uses this varying voltage as a control input.

In the instance where it is desirable to change the range of resistors 24a–24L, a carrier 76a (FIG. 2) having resistors 24m–24x of a different range is substituted for the existing carrier 76 in receptacle 80. For example, by changing resistors with values multiplied by 10 from that described, one can obtain a range of resistance from 10 ohms to 40,950 ohms.

From the foregoing, it is to be appreciated that the applicants have provided a digitally controlled, variable resistance circuit having a high degree of accuracy, resolution, and linearity. Further, this circuit is designed to easily implement different ranges of resistances by simply changing a single plug-in component. Thus, while the invention has been described with respect to embodiments shown, it will be obvious to those skilled in the art that various modifications and changes can be made without departing from the true spirit and scope of the invention as described in the following claims.

I claim:

1. A digitally controlled system for effecting and presenting a selected electrical resistance, said system comprising:

digital means for providing a plurality of separate binary outputs, each representative of a separate numerical value of a binary count, and each representative of a discrete selected value of resistance;

a plurality of switching means, each having a control input coupled to a corresponding one of said plurality of binary outputs, and each of said switching means further including a set of first and second switched terminals, said terminals being electrically switched between a shorted or opened condition responsive to a discrete one of said binary outputs, said sets of switched terminals being serially connected; and a plurality of serially coupled resistors having resistive values selected according to an expression $2^{N-1}(R)$, where N is the number of terms in said expression, and R is a lowest value of resistance, with discrete ones of said plurality of resistors being connected across discrete said sets of said switched terminals, and said plurality of resistors ordered in their connections to said plurality of sets of terminals such that, when selected resistors are electrically summed, a linear sequence of numerical values of resistance is generated responsive to said digital means.

2. A system as set forth in claim 1 wherein said plurality of resistors are mounted on a carrier having electrical contact pins, and said plurality of resistors is electrically coupled to said pins, said pins being pluggable into a matching receptacle connected in circuit with said switch means, whereby a range of resistance is changed.

3. A system as set forth in claim 2 comprising:

a decimal decoder having a plurality of inputs and an output, said plurality of inputs coupled to said plurality of binary outputs of said analog-to-digital conversion means; and a digital display having an input coupled to said output of said decimal decoder, whereby a value of resistance is displayed.

4. A system as set forth in claim 1 wherein said digital means comprises a programmable digital computer including buffer storage means having a plurality of ordered binary storage locations coupled to said computer for providing temporary storage for said plurality of separate binary outputs.

5. A system as set forth in claim 4 wherein said digital means comprises:

variable voltage means, including a potentiometer coupled to a voltage source, for providing a variable voltage; and analog-to-digital conversion means responsive to said variable voltage for providing said plurality of binary outputs.

6. A system as set forth in claim 1 wherein each of said plurality of switching means comprises:

optical couplers having said control input and third and fourth terminals comprising emitter and collector terminals, respectively, of a light responsive transistor, said emitter and collector terminals being switched responsive to a discrete one of said binary outputs applied to said control input; and a field effect transistor having a gate input coupled to said collector terminal, and wherein said first and second switched terminals comprise source and drain terminals of said field effect transistor, whereby a discrete one of said binary outputs is electrically isolated from one of said plurality of resistors coupled between said source and said drain terminals, and said last-named output is optically coupled to said gate input of said field effect transistor.

7. A system as set forth in claim 6 comprising positive bias voltage means coupled between each said collector terminal of each said light responsive transistor and each said gate input of said plurality of field effect transistors for providing a positive bias with respect to ground to each said gate input of each said field effect transistor, whereby said plurality of field effect transistors are biased normally "on."

8. A system as set forth in claim 6 comprising negative bias voltage means coupled to said emitter of each said light responsive transistor for applying a negative bias to selected gate inputs of selected said field effect transistors, whereby said selected field effect transistors are biased "off" responsive to discrete ones of said binary outputs applied to said selected control inputs, thereby including a selected resistor connected between said source and drain terminals of said selected field effect transistors in circuit with said selected resistors which are electrically summed.

* * * * *